US010063220B2

(12) United States Patent
Mainescu et al.

(10) Patent No.: US 10,063,220 B2
(45) Date of Patent: Aug. 28, 2018

(54) SIGNAL GENERATOR WITH MULTIPLE OUTPUTS

(71) Applicant: METROTECH CORPORATION, Santa Clara, CA (US)

(72) Inventors: George Mainescu, Hillsdale, NJ (US); Ion Dracea, Campina (RO); Razvan Gabriel Stefanoiu, Campina (RO); Paul Lucian Lacatus, Campina (RO)

(73) Assignee: METROTECH CORPORATION, Santa Clara, CA (US)

( * ) Notice: Subject to any disclaimer, the term of this patent is extended or adjusted under 35 U.S.C. 154(b) by 310 days.

(21) Appl. No.: 15/004,829

(22) Filed: Jan. 22, 2016

(65) Prior Publication Data

US 2016/0218702 A1 Jul. 28, 2016

Related U.S. Application Data

(60) Provisional application No. 62/107,287, filed on Jan. 23, 2015.

(51) Int. Cl.
 *H03K 5/15* (2006.01)
 *H03K 17/00* (2006.01)
 *G01V 13/00* (2006.01)

(52) U.S. Cl.
 CPC ......... *H03K 5/15013* (2013.01); *G01V 13/00* (2013.01); *H03K 17/007* (2013.01)

(58) Field of Classification Search
 CPC ... H03K 5/15013; H03K 17/007; G01V 13/00
 USPC ......... 324/326, 323, 500, 512, 528, 66, 337, 324/379, 250, 754.06, 754.31, 631, 637, 324/645, 76.12, 76.14, 76.56, 84, 95
 See application file for complete search history.

(56) References Cited

U.S. PATENT DOCUMENTS

| | | | |
|---|---|---|---|
| 5,530,367 A | 6/1996 | Bottman | |
| 5,748,009 A | 5/1998 | Bertolet et al. | |
| 7,028,281 B1 | 4/2006 | Agrawal et al. | |
| 2007/0022345 A1 | 1/2007 | Smith | |
| 2013/0049767 A1 | 2/2013 | King et al. | |
| 2013/0287125 A1* | 10/2013 | Petherick | H04B 3/04 375/257 |

(Continued)

OTHER PUBLICATIONS

International Search Report for PCT Application No. PCT/US2016/014634 issued by the US Searching Authority dated Jun. 3, 2016; pp. 1-4.

(Continued)

*Primary Examiner* — Melissa Koval
*Assistant Examiner* — Trung Nguyen
(74) *Attorney, Agent, or Firm* — Haynes and Boone, LLP

(57) ABSTRACT

A signal generator that provides signals for multiple outputs is presented. In some embodiments, a signal generator can include switching circuitry that is coupled to provide a signal to an active output of a plurality of outputs in response to control signals; a driver that provides the signal to the switching circuitry, the signal being at a frequency appropriate for the active output; and a logic that provides the control signals to the switching circuitry and provides a waveform to the driver, the waveform having the frequency appropriate for the active output, the control signals indicating which of the plurality of outputs is the active output.

18 Claims, 3 Drawing Sheets

(56) References Cited

U.S. PATENT DOCUMENTS

2015/0369942 A1* 12/2015 Polak .................... G01V 3/107
324/326

OTHER PUBLICATIONS

Written Opinion of the International Searching Authority for PCT Application No. PCT/US2016/014634 issued by the US Searching Authority dated Jun. 3, 2016; pp. 1-4.

* cited by examiner

SIGNAL GENERATOR WITH MULTIPLE OUTPUTS

RELATED APPLICATION

This application is related to and claims priority to U.S. Patent Provisional Application 62/107,287 entitled "Transmitter with Multiple Outputs," filed on Jan. 23, 2015, which is herein incorporated by reference in its entirety.

BACKGROUND

Technical Field

The present disclosure relates to a location of utility resources and, in particular, to a signal generator for a line locator system that provides multiple signals.

Discussion of Related Art

Underground pipe and cable locators (often termed line locators) have existed for many years and are described in many issued patents and other publications. Line locator systems typically include a mobile receiver and a transmitter. The transmitter is coupled to a target conductor, either by direct electrical connection or through induction, to provide a current signal on the target conductor. The receiver detects and processes signals resulting from the magnetic field generated at the target conductor as a result of the current signal, which can be a continuous wave sinusoidal signal provided to the target conductor by the transmitter.

Therefore, there is a need for line location systems with better transmitters to more efficiently find underground lines.

SUMMARY

In accordance with some embodiments, a signal generator that couples signals to multiple outputs is presented. In some embodiments, the signal generator includes switching circuitry that is coupled to provide a signal to an active output of a plurality of outputs in response to control signals; a driver that provides the signal to the switching circuitry, the signal being at a frequency appropriate for the active output; and a control circuit that provides the control signals to the switching circuitry and provides a waveform to the driver, the waveform having the frequency appropriate for the active output, the control signals indicating which of the plurality of outputs is the active output.

These and other embodiments will be described in further detail below with respect to the following figures.

The drawings may be better understood by reading the following detailed description.

DETAILED DESCRIPTION

Embodiments of the present invention allow for enhanced utilization of line locator systems with a signal generator that couples signals to multiple outputs, each of the outputs coupled to different loads known as lines. Appropriate signals are provided to each of the lines so that each line is active a portion of the time.

A user out in the field, far away from the place where the locating transmitter is connected to the target line, conventionally would have to reconfigure the transmitter to locate a different target line. Consequently, in accordance with some embodiments the transmitter is replaced with a signal generator that can be coupled to a plurality of target lines. A user may increase her work efficiency, then, by switching the locating device (receiver) to a different frequency when moving from a first target line to another second target line. In accordance with some embodiments, the user can set, using the user interface, the desired number of independent outputs that are coupled to corresponding target lines, the frequency of each of the output signals and also the output levels of each of the output signals for each of the independent outputs.

The receiver can then detect any one of the target lines by detecting the specific signal that is provided by a corresponding independent output of the signal generator to a particular target line coupled to the independent output. In some embodiments, each of the outputs from the signal generator is activated at a large enough percentage of the total time of operation that the receiver tuned to one of the frequencies for location of a particular target line will detect a pseudo continuous signal, which is a non-continuous signal that occurs with sufficient frequency that the receiver interprets it as a substantially continuous signal. The user can then switch the receiver to a different frequency for detecting a different line coupled to a different output in order to detect multiple lines without reconfiguring the signal generator.

Figure 1:
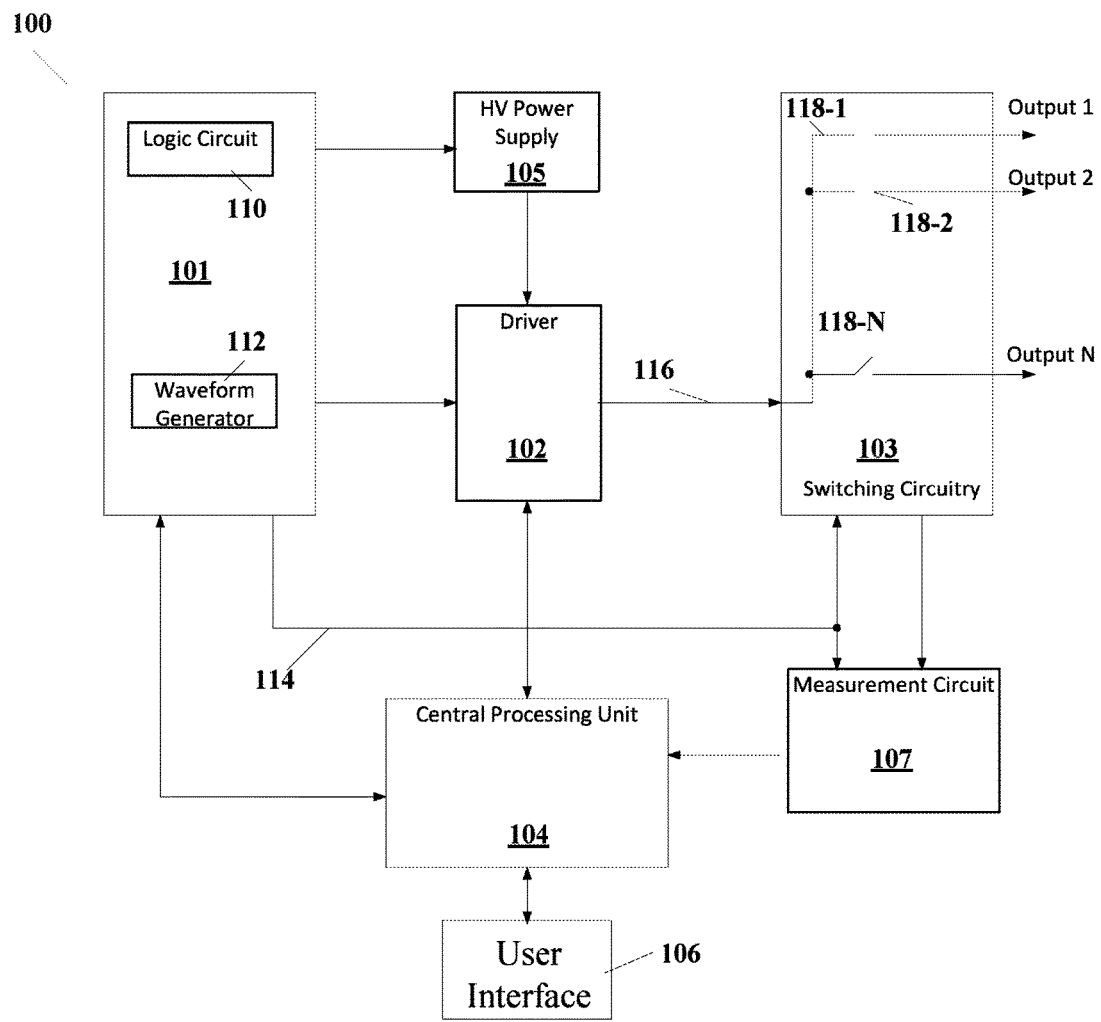
FIG. 1 illustrates a signal generator according to some embodiments.

FIG. 1 illustrates a block diagram of a signal generator 100 according to some embodiments. Signal generator 100 can drive different signals into multiple loads. The multiple loads (also referred to as lines in this disclosure) may be, for example, underground cables or pipes, but signal generator 100 may also be used with other types of loads.

As shown in FIG. 1, signal generator 100 includes a control module 101, driver/power amplifier (PA) module 102, measure circuitry module 107, switching circuitry module 103, high-voltage (HV) power supply 105, central processing unit 104 and a user interface 106 coupled to central processing unit 104. Logic circuit 110 determines which of N outputs to be activated in a particular time period, generates control signals 114 to switching circuitry 103, and informs waveform generator 112 to generate a signal with the corresponding frequency for the currently active output line.

Logic circuit 110 also controls HV power supply 105, which can operate in any fashion to provide the appropriate supply voltage to the driver or power amplifier 102 for the currently active output. The appropriate voltage from HV power supply 105 and the signal from waveform generator 112 is provided to driver 102. Driver 102 generates the appropriate signal on line 116 to drive the corresponding active output in switching circuit 103. Switching circuit 103, in response to control signals 114, closes one of switches 118-1 through 118-N in order to provide the signal on line 116 from driver 102 to the active one of individual outputs 1-N, respectively. The signal on line 116 has a particular voltage and frequency and is capable of driving the load coupled to the corresponding active output.

Central processing unit 104 is coupled to control the functionality of signal generator 100. Central processing unit 104 is coupled to user interface 106. User interface 106 may include user input devices (e.g., keyboards, touchscreen, pointing devices, or other devices) and may include a display. Central processing unit 104 may be any processor, including a microprocessor, along with storage memory, input-output drivers, and other circuitry.

Through user interface 106, a user can input the number of outputs to be connected to signal generator 100, as well as the frequency and signal levels of each of the outputs. As shown in FIG. 1, up to N outputs can be connected to signal generator 100, where N is an integer greater than two (2). In some embodiments, signal generator 100 can also be configured to drive a single continuous output. The user will also allocate a specific frequency to each of the outputs and select an output signal level that is appropriate for that output. In general, frequencies on each output may be different in order that a receiver can distinguish between outputs. Central processing unit 104 sends signals to control circuit 101, which in turn sets up the various waveforms in waveform generator 112 and control signals 114 to transmit the appropriate signal at appropriate time frames to switching circuitry 103.

As such, logic 101 generates the switching control signals 114 that connect signal 116 repeatedly through the appropriate ones of switches 118-1 through 118-N to outputs 1-N, respectively. Switching of switches 118-1 through 118-N is coordinated with switching of the frequency and signal levels provided to signal 116 that correspond with the particular active one of outputs 1-N. As is illustrated in FIG. 1, switching circuitry 103 will activate one of outputs 1-N at a time. In some embodiments, a user through user interface 106 can select the number of outputs n to activate (n≤N) along with the output levels $I_i$ and frequency $f_i$ for each of the outputs i (=1 ... n). In some embodiments, the user may also select the order in which the n selected outputs are cycled during operation of signal generator 100.

In some embodiments, in an initialization process, a measurement circuitry 107 measures the output signal on line 116. In some embodiments, the output levels for a particular output level is reported to the central processing unit 104 and central processing unit 104 can adjust the output signal level accordingly. In some embodiments, module 101 may communicate adjustments to power supply 105 in order to meet the parameters set for that output by central processing unit 104. Device 100, through the initialization process for each of the chosen outputs i, analyzes the output parameters measured by measurement circuitry 107, which are dependent on the actual load coupled to each of outputs i, to achieve the appropriate frequency and requested current level for each of the outputs. As such, each of outputs 1 through n are driven by driver 102 as characterized by the user and parameters in driver 102, adjusted for each output, to generate the needed levels for each of the activated outputs. The output levels that are adjusted by the user can include current levels, voltage levels or power levels, which may differ with use of device 100.

As described above, measurement circuit 107 monitors the output of the signal generator 100 for the desired current and/or voltage on each of the outputs. Measurement circuit 107 operates in synchrony with the active output at any given time and consequently measures the actual output signal level and actual frequency for the active output. As illustrated in FIG. 1, power supply 105 delivers power to driver 102, which provides the actual output signal level and actual frequency on line 116 in synchronization with the active output at any given time in accordance with signals from controller 101. Central processing unit 104 receives the measurements from measurement circuit 107 and offer the user interface for displaying the relevant information for the user. In some embodiments, central processing unit 104 can then adjust the output parameters (frequency, signal levels, outputs, output sequence, etc.) in response to the measured parameters. In some embodiments, adjustments of parameters can be made directly in control module 101.

In some embodiments, during operation logic circuit 110 of module 101, in response to a clock, cycles through each of the selected outputs i. Each of outputs 1 through n is connected during a particular time interval. As such, logic 110, at the beginning of the time interval assigned to a particular one of outputs, output i for example, sets waveform generator 112 to provide a signal with frequency $f_i$, sets HV power supply 105 and module 102 to provide the appropriate voltage, current, or power level for output i, sets switching circuitry 103 to couple output i to module 102, and then initiates output through module 102 to provide the appropriate signal on output i. Near the end of the time interval assigned to output i, logic 110 shuts off output i and begins set up for the appropriate signaling for output i+1. In some embodiments, central processing unit 104 controls the switching times in place of logic circuit 110. As such, central processing unit 104 directs logic circuit 110 to perform its tasks as described above. In either case, parameters that control the operation of each of the n active outputs can be stored in memory of central processing unit 104. In some embodiments, such parameters can be stored in registers in module 101.

Figure 2:
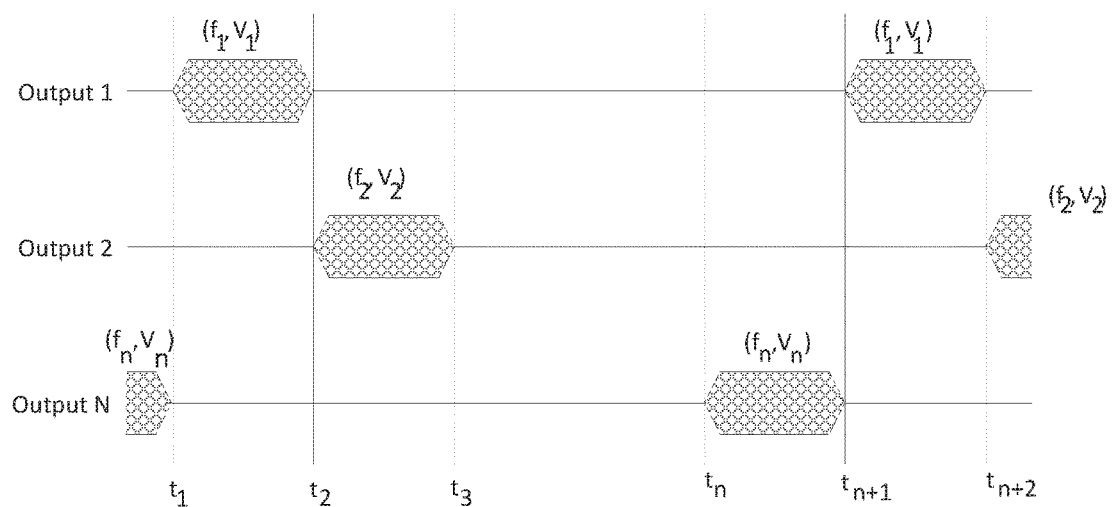
FIG. 2 illustrates an example timing diagram for a signal generator such as that shown in FIG. 1.

FIG. 2 illustrates the signals applied to outputs i=1 through n as a function of time. Although the outputs may be connected and cycled in any order, the particular example illustrated in FIG. 2 sequentially activates the outputs. As illustrated in FIG. 2, output 1 is activated with voltage level $V_1$ and frequency $f_1$ at time interval $t_1$. Output 2 is activated at voltage level $V_2$ and frequency $f_2$ at time interval $t_2$. Output n is activated with voltage level $V_n$ and frequency $F_n$ at time interval $t_n$. At time interval $T_{n+1}$, the sequence starts over.

The switching control signals 114, which switch the outputs synchronously with switches in voltage and frequency outputs, can be switched at a fast enough rate that a receiving device tuned to a particular one of frequencies $f_1$ through $f_n$ will receive a signal from the output coupled to that particular frequency as a continuous enough signal to allow the receiver to locate the line (load) coupled to that output. The user can then locate the lines coupled to other outputs by simply switching frequencies to the frequency assigned to the output connected to that line.

In some embodiments, logic 101 can be a complex integrated device or can be independent, separate, circuits configured to generate the needed signals. Central processor 104 can be any processor, for example a microprocessor, along with the related components (e.g., drivers, memory, etc.). In some embodiments, outputs 1 through N can be coupled to corresponding target lines through direct connection, clamping, induction or in any other way that the signal can be transferred to the corresponding load.

Figure 3:
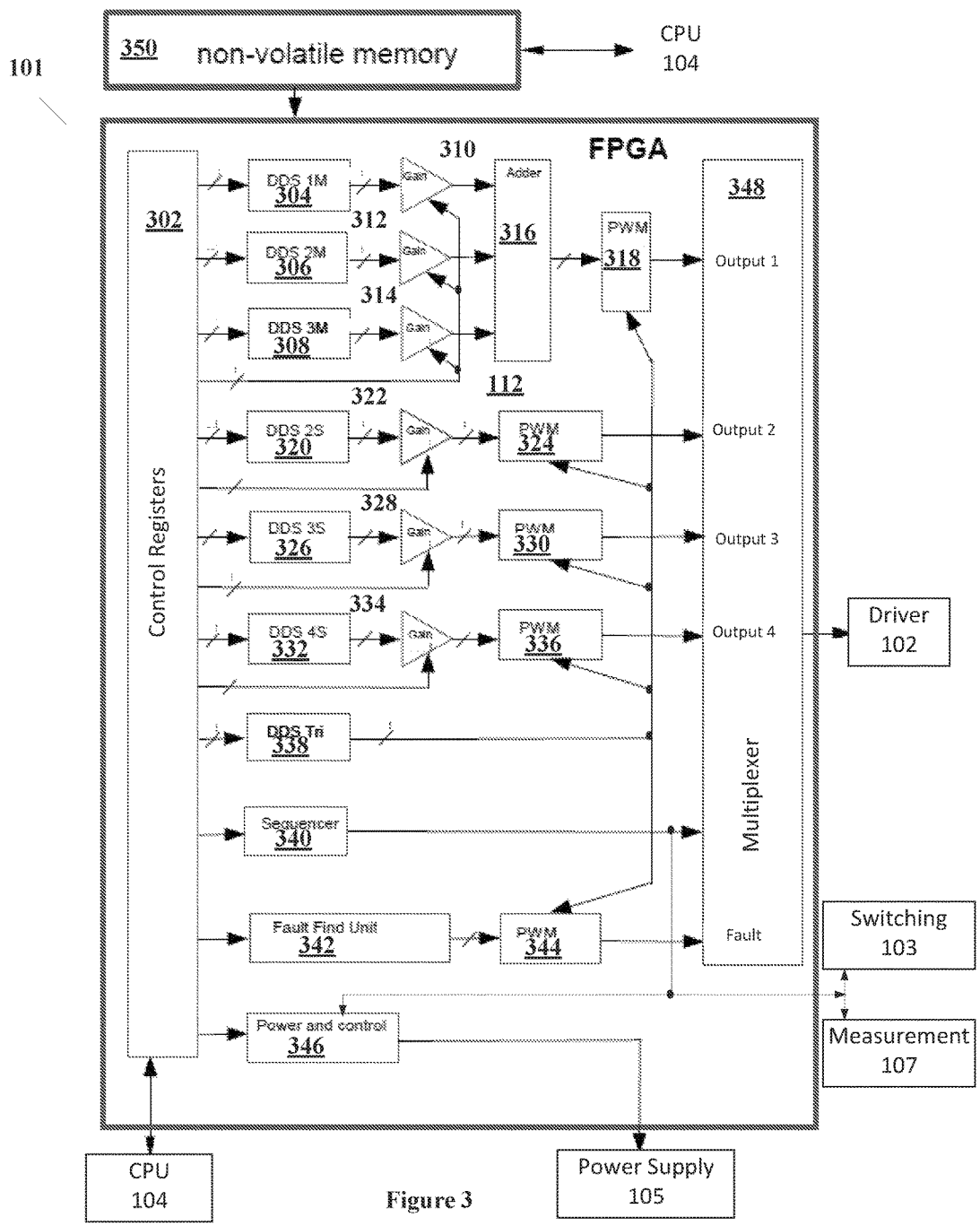
FIG. 3 illustrates an example of control circuit as is illustrated in FIG. 1.

FIG. 3 illustrates an example of control circuit module 101 as illustrated in FIG. 1. The example of control circuit module 101 includes waveform generator module 112 and a logic circuit module 110 within control module 101 implemented in a Field Programmable Gate Array (FPGA). As is illustrated in FIG. 3, control module 101 can be implemented in a fully digital form, in this case in a FPGA device. However, the circuit module 101 illustrated in FIG. 3 is an example of a control circuit module and one skilled in the art will recognize other ways of implemented control module 101. FIG. 3 illustrates an example with 1, 2, 3, or 4 outputs, however one skilled in the art will recognize that an implementation having any number of outputs N can be formed with the same implementation.

As illustrated in FIG. 3, control registers 302 includes a set of registers that can be written or read by CPU unit 104 over a bus, which may be an I2C protocol bus. Control registers 302 may also receive input from a memory block 350, which may be non-volatile memory. Memory block 350 may provide parameters for other portions of control unit 101 as well, including the configuration for the FPGA used to form control module 101. Memory block 350 may also be written or read by CPU unit 104 and may be loaded into the FPGA of control circuit 101 at startup. The registers in control registers 302 provide the control parameters to the remainder of control circuit 101.

As discussed above, memory block 350, which may include parameters to write into control registers 302, and control registers 302 communicate with central processing unit 104. In some embodiments, processing unit 104 can be using a 32 bit microcontroller. Alternatively, any processor or microcontroller can be used to implement processing unit 104. Processing unit 104 provides and reads parameters to control registers 302, for example through an I2C bus, that control the operation control circuit module 101. Further, processing unit 104 can communicate with memory module 350, which as described above, provides the configuration for the FPGA implementation of control circuit 101. In some embodiments, some parameters to be written into control registers 302 may also be stored in memory module 350 and loaded during startup along with the configuration of FPGA.

As is illustrated in FIG. 3, waveform generator module 112 can be implemented with Direct Digital Synthesizer (DDS) techniques. The frequency signal for the first output can be generated with a sum of multiple waveforms. In the example illustrated in FIG. 3, up to three (3) waveforms are implemented with the help of three (3) independent DDS circuits. As illustrated in FIG. 3, DDS1M 304, DDS2M 306, and DDS3M 308 are coupled to one or more registers in control registers 302 and produce a waveform according to the parameters stored in those registers. The synthesized digital waveforms produced by each of DDS1M 304, DDS2M 306, and DDS3M 308 are input to gain modules 310, 312, and 314, respectively. Gain modules 310, 312, and 314 each have a gain controlled by one or more registers in control registers 302. Although the example in FIG. 3 illustrates that each of gain modules 310, 312, and 314 have a common gain, in some embodiments, each of gain modules 310, 312, and 314 may have an independent gain controlled by independent registers in control registers 302. The amplified waveforms from each of gain modules 310, 312, and 314 are summed in a programmable adder unit 316.

As further illustrated in FIG. 3, output 2 is formed by DDS2S 320 coupled to gain module 322. As illustrated, DDS2S 320 is coupled to one or more registers in control registers 302 and outputs a waveform in response to parameters stored in those registers. The waveform generated by DDS2S 320 is amplified by gain module 322, the gain of which is controlled by one or more register in control registers 302.

Output 3 is formed by DDS3S 326 coupled to gain module 328. As illustrated, DDS3S 326 is coupled to one or more registers in control registers 302 and outputs a waveform in response to parameters stored in those registers. The waveform generated by DDS3S 326 is amplified by gain module 328, the gain of which is controlled by one or more registers in control registers 302.

Output 4 is formed by DDS4S 332 coupled to gain module 334. As illustrated, DDS4S 332 is coupled to one or more registers in control registers 302 and outputs a waveform in response to parameters stored in those registers. The waveform generated by DDS4S 332 is amplified by gain module 334, the gain of which is controlled by one or more registers in control registers 302.

As is illustrates, multiple channels can be implemented with DDS techniques, each coupled to a gain module. The waveform generated by the DDS and the gain of the gain module can be controlled by one or more registers in control registers 302.

The waveforms formed for each of the outputs, i.e. the output signals from adder 316, gain module 322, gain module 328, and gain module 334, are input to Pulse Width Modulators (PWM) units PWM 318, PWM 324, PWM 330, and PWM 336, respectively. Additionally, a triangle signal generated in DDS TRI 338 is input to each of PWM 318, PWM 324, PWM 330, and PWM 336 modules. Each of PWM 318, PWM 324, PWM 330, and PWM 336 modules compares the triangle signal generated in DDS TM 338 with the waveforms output be adder 316, gain module 322, gain module 328, and gain modules 334 and output signals with waveforms appropriate for output 1, output 2, output 3, and output 4 are generated and input to multiplexer 348.

As is illustrated in FIG. 3, control circuit 101 digitally generates the waveforms input to multiplexer 348. In some examples, for example, DDSes 304, 306, 308, 320, 326, 332, and 338 can be implemented using phase accumulator registers, for example with register sizes of 32 bits. Other register sizes can also be used.

The output signal from multiplexer 348 is input, as is illustrated in FIG. 3 and FIG. 1, to driver 102. Multiplexer 348 controls the time of transmission of each waveform, for example corresponding to output 1, output 2, output 3, and output 4. As illustrated, multiplexer 348 is controlled by a programmable sequencer unit 348 that will decide the sequence of outputting any of the outputs described above in accordance with parameters received from one or more registers in control registers 302. As illustrated, timing signals from sequencer 340 also are output to switching module 103 and measurement module 107. Further, timing signals from sequencer 340 are also input to power control module 346, which output signals to power supply 105 in accordance with the timing signals from sequencer 340 and parameters stored in one or more registers of control registers 302.

In some embodiments, a fault waveform can also be generated. As illustrated in FIG. 4, fault find unit 342, which may include a fault DDS and gain module controlled by one or more registers in control registers 302, provides a waveform input to PWM 344, which operates as PWM 318, PWM 324, PWM 330, and PWM 336 above. The output signal from PWM 344 can also be input to multiplexer 348. Sequencer 340, in fault find mode, may couple the fault waveform with any of the outputs provided by switching 103 in order to provide a fault finding signal.

As is further illustrated in FIG. 3, control circuit 101 also includes a Power Supply control module 346, which may include protection circuitry for power supply module 105 and driver 102. As illustrated in FIG. 3, power control module 346 receives sequencing information from sequencer 340 and provides control signals to power supply 105 to provide the signal levels for the active output, as determined by sequencer 340, to driver 102.

As discussed above, with reference to FIG. 1, a user can enter, and can be prompted to enter, parameters through the user interface module 106, which may include a keypad or a touchscreen. User selectable parameters may, for example, include frequency of operation, number of outputs, and output signal levels (current, voltage, or power). Once the parameters have been entered into processing module 104, processing module 104 can load the parameters to control circuit module 101. Control circuit module 101 can then be set to control the signal levels, frequencies, and sequence of signals to the outputs of signal generator 100 in accordance with the parameters, outputs, and sequencing programmed by the user. In some embodiments, standard parameters sets may be stored in processing module 101 or memory 350, so that a user need not enter each parameter on every use and instead may choose between preprogrammed sets of parameters.

In some embodiments, power supply module 105 can be a high voltage power supply that that will provide the needed voltage and current to the driver 102. In some embodiments, power supply module 105 can be a switch mode power supply, but any other architecture can be used. Power supply module 105 may deliver an adjustable voltage based on the controls received from power and control 346 module of control circuit module 101. The power supplied by power supply module 105 to driver 102 is in sync with the activated output channel in switching circuitry module 103, and this way the needed current is delivered by driver 102 to each of the loads connected to the outputs in turn.

Driver module 102 can be a power amplifier that delivers the output signals to the load of the active output at the programmed signal levels and frequencies. In some embodiments, Driver module 102 can be a switch mode bridge amplifier configuration, but any other type of amplifiers may be used. The frequency input waveform for this module, as shown in FIG. 3, is a digital string of pulse-wave modulated pulses appropriate for the selected output from multiplexer 348.

As described above, the output signal level is controlled by adjusting the power supply voltage output from power supply module 105 for each of the activated channels. A second way of adjusting the level of the output signal from driver 102 can be accomplished by changing the PWM modulation depth. The PWM modulation depth can be accomplished by adjusting the gains of gain module 310, 312, 314, 322, 328, and 324 in FPGA implemented control circuit module 101.

The output signal from module 102, that is now at the requested output levels for each of the activated lines pass through Switching Circuitry module 103. In this module, the appropriate output signal of the requested frequency and amplitude is routed to the correct output line through switches 118-1 through 118-N (see FIG. 1) as directed by sequencer 340. Switches 118-1 through 118-N for each of the outputs can be implemented using pairs of solid state devices such as transistors. However, switches 118-1 through 118-N can be implemented by any other devices that are capable of performing the switching function. Being under the command of the control circuit module 101, switches 118-1 through 118-N may also perform an output protection function by disengaging under particular operating conditions (e.g., if a short circuit is detected on a load connected to an output).

As discussed above, switching circuitry 103, high voltage power supply 105, and the frequency signal received into driver 102 from control circuit 101 are synchronized in such a way that during each time period the generated frequency is routed to the appropriate output with the appropriate signal level, as is discussed with respect to FIG. 2. As is further shown in FIG. 1, the actual output signal levels for each of the active outputs are measured and monitored in measurement circuit module 107. Measurement circuit module 107 can include a voltage detector, a current detector, and/or a frequency detector. Any implementation of these detectors can be used. Data from the measurement circuit 107 can be input to processing unit 104, where parameters loaded into control circuit module 101 to maintain the needed output signal levels and frequencies can be adjusted. Central processing unit 104 can also display output signal levels and frequencies measured by measurement circuit module 107 on user interface 106.

In the preceding specification, various embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

What is claimed is:

1. A signal generator, comprising:
  switching circuitry that is coupled to provide a signal to an active output of a plurality of outputs in response to control signals;
  a driver that provides the signal to the switching circuitry, the signal being at a frequency associated with the active output; and
  a control circuit that provides the control signals to the switching circuitry and provides a waveform to the driver, the waveform having the frequency associated with the active output, the control signals indicating which of the plurality of outputs is the active output,
  wherein the control circuit cycles the active output through at least two of the plurality of outputs such that the active output is switched to a first output of the plurality of outputs in a first time period and the active output is switched to a second output of the plurality of outputs in a second time period.

2. The signal generator of claim 1, further including a central processing unit, the central processing unit coupled to the switching circuitry, the driver, and the control circuit and providing initialization parameters that determine frequency and signal levels to associate with each of the plurality of outputs.

3. The signal generator of claim 1, wherein the driver receives power from a high voltage power supply.

4. The signal generator of claim 3, wherein the driver adjusts a voltage or a current according to each of the plurality of outputs according to parameters for each of the plurality of outputs.

5. The signal generator of claim 3, wherein the control circuit includes a logic circuit and a waveform generator.

6. The signal generator of claim 5, wherein the logic circuit provides control signals to the high voltage power supply, the waveform generator, and the switching circuit to cycle through each of the plurality of outputs according to the parameters for each of the plurality of outputs.

7. The signal generator of claim 1, wherein the control circuit is a field-programmable gate array.

8. The signal generator of claim 7, wherein the control circuit comprises:
  control registers that receive and store parameters;
  a plurality of frequency generators coupled to the control registers providing frequencies for each of the plurality of outputs;
  a multiplexer coupled to receive frequency signals from each of the plurality of frequency generators; and a sequencer coupled to the control registers and the multiplexer, the sequencer providing the control signals determining the active output.

9. The signal generator of claim 8, wherein the plurality of frequency generators include direct digital synthesizers coupled to gain units.

10. The signal generator of claim 9, wherein one of the plurality of frequency generators includes a plurality of direct digital synthesizers provided to an adder.

11. The signal generator of claim 9, wherein the plurality of frequency generators each include a pulse-wave modulator that compares a signal from the direct digital synthesizers to a triangular signal to provide the frequency signal.

12. The signal generator of claim 8 further including a fault-find signal generator.

13. The signal generator of claim 8, further including a power supply controller coupled to the control registers and providing a signal appropriate for the active output to a high voltage power supply, the high voltage power supply supplying power to the driver.

14. The signal generator of claim 8, wherein parameters that control operation of the control circuit are loaded into the control registers from a processing unit.

15. A method of operating a signal generator to provide signals to a plurality of outputs, the method comprising:
coupling, with a switching network controlled by a control circuit, a first signal from a driver to a first output of the signal generator during a first time period, the first signal having a first frequency associated with the first output; and
coupling, with the switching network, a second signal from the driver to a second output during a second time period following the first time period, the second signal having a second frequency associated with the second output, the second frequency differs from the first frequency,
wherein the control circuit cycles the switching network through the first signal associated with the first output and the second signal associated with the second output.

16. A method of operating a signal generator to provide signals to a plurality of outputs, comprising:
controlling a switching circuit with a controller to cycle through each of the plurality of outputs by
providing a signal associated with one of the plurality of outputs assigned to a next time period with a driver controlled by the controller;
at the beginning of the next time period, switching the signal to the output of the plurality of outputs assigned to the next time period; and
at the end of the next time period, removing the signal.

17. The method of claim 16, further including
initializing parameters prior to sequentially cycling through the plurality of outputs.

18. The method of claim 17, wherein initializing parameters includes
receiving user input parameters detailing signal levels and frequencies for each of the plurality of outputs;
testing actual signal levels against the user input parameters; and
adjusting actual parameters from the user input parameters such that actual signal levels matches the user input parameters.

* * * * *